United States Patent
Kerkman et al.

(10) Patent No.: US 8,704,571 B2
(45) Date of Patent: Apr. 22, 2014

(54) PHASE-LOCKED-LOOP WITH QUADRATURE TRACKING FILTER FOR SYNCHRONIZING AN ELECTRIC GRID

(75) Inventors: Russel J. Kerkman, Milwaukee, WI (US); Ahmed Mohamed Sayed Ahmed, Mequon, WI (US); Brian J. Seibel, Grafton, WI (US); Carlos Rodriguez Valdez, Glendale, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 13/468,905

(22) Filed: May 10, 2012

(65) Prior Publication Data

US 2013/0120038 A1    May 16, 2013

Related U.S. Application Data

(60) Provisional application No. 61/559,661, filed on Nov. 14, 2011.

(51) Int. Cl.
*H03L 7/06* (2006.01)

(52) U.S. Cl.
USPC ......... 327/159; 327/150; 327/156; 324/76.39

(58) Field of Classification Search
USPC .................... 327/141, 144–163; 331/15–17; 375/373–376
See application file for complete search history.

(56) References Cited

U.S. PATENT DOCUMENTS

| | | | |
|---|---|---|---|
| 4,890,072 A * | 12/1989 | Espe et al. ...................... 331/11 |
| 5,388,127 A * | 2/1995 | Scarpa ........................ 375/376 |
| 7,400,690 B2 * | 7/2008 | Sun et al. ...................... 375/297 |
| 7,502,602 B2 * | 3/2009 | Wolf .............................. 455/260 |
| 7,528,666 B2 * | 5/2009 | Gomez ........................... 331/17 |
| 2005/0074082 A1 * | 4/2005 | Citta et al. .................... 375/376 |
| 2009/0085677 A1 | 4/2009 | Lewis |
| 2010/0213925 A1 * | 8/2010 | Teodorescu et al. ....... 324/76.78 |
| 2011/0140752 A1 | 6/2011 | Garg et al. |
| 2011/0285380 A1 * | 11/2011 | Rodriguez et al. ......... 324/76.39 |
| 2012/0007642 A1 | 1/2012 | Miyahara |
| 2012/0154031 A1 | 6/2012 | Zuckerman |
| 2012/0161829 A1 | 6/2012 | Fernald |

OTHER PUBLICATIONS

Chung, Se-Kyo, A Phase Tracking System for Three Phase Utility Interface Inverters, IEEE Transactions on Power Electronics, vol. 15, No. 3, May 2000.

Rodriguez, P., Decoupled Double Synchronous Reference Frame PLL for Power Converter Control, IEEE Transactions on Power Electronics, vol. 22, No. 2, Mar. 2007.

* cited by examiner

*Primary Examiner* — Brandon S Cole
(74) *Attorney, Agent, or Firm* — Fletcher Yoder, P.C.; Alexander R. Kuzewski; John M. Miller

(57) ABSTRACT

Methods and systems for synchronizing an electric grid having unbalanced voltages are provided. A voltage vector may be filtered in a quadrature tracking filter (QTF) to generate a quadrature signal. A phase-locked-loop (PLL) operation may be performed on the quadrature signal to monitor a voltage vector between the grid and a connected power converter. The QTF and PLL methods are suitable for either single-phase applications or n-phase (any number of phases) applications. A frequency estimator estimates the grid frequency of the electric grid and outputs the estimated frequency to the QTF algorithms. The frequency estimator may include a three-phase phase-locked-loop (three-phase PLL) suitable for estimating the center frequencies of multiple phases of the electric grid. The frequency estimator may also include means for reducing the harmonics in the grid system.

20 Claims, 5 Drawing Sheets

PHASE-LOCKED-LOOP WITH QUADRATURE TRACKING FILTER FOR SYNCHRONIZING AN ELECTRIC GRID

CROSS REFERENCE TO RELATED APPLICATIONS

This application is a Non-Provisional of U.S. Provisional Patent Application No. 61/559,661, entitled "A Phase-Locked-Loop with Quadrature Tracking Filter for Synchronizing an Electric Grid", filed Nov. 14, 2011, which is herein incorporated by reference in its entirety.

BACKGROUND

The invention relates generally to electrical networks, and more specifically, to methods of synchronizing input signals into the electrical networks.

Electric devices may be connected or organized in a network to enable the transmission of power to the devices, or communication between the devices. Such a network of interconnected devices may be described as a grid. For example, an electric grid may be an interconnected network for delivering electricity from one or more power generators to the connected devices (e.g., customers of the utility company). A power grid may transmit AC power at a synchronized frequency, amplitude, and/or phase angle to efficiently connect a large number of power generators and devices. Synchronized operation of a grid, or portions of a grid, may enable a pooling of power generation, as well as a pooling of loads to result in lower operating costs.

The synchronized transmission of AC power may be beneficial for efficiently transmitting and/or distributing of power. However, many factors may disturb the synchronization of a grid. For example, voltage imbalances, angular frequency variations, and voltage harmonic distortions may significantly disturb grid synchronization. In particular, voltage imbalances may be common in a power grid, as single phase loads of a grid may not be evenly distributed between the phases of the supplied power and may be continuously connected and disconnected. Such discrepancies in the amplitudes, frequencies, and/or phase angles between two parallel voltages may cause abnormal current circulation within the grid which may result in a large current imbalance. Imbalanced currents may stress grid devices, such as AC-DC converters, cycloconverters, active filters, induction motors, and other energy storage systems which function to convert and/or transfer power through the grid to the connected electric devices. Imbalanced current may also stress grid link inductors and capacitors, and imbalanced current in one end device of a grid may introduce a torque ripple through the grid.

Power converters used in single-phase applications such as fundamental front end (FFE) regenerative braking may be even more susceptible to damages or inefficiencies resulting from imbalanced current, as the DC bus voltage ripple may become higher in single-phase applications than in three-phase applications due to the relatively higher input current and high DC bus capacitor ripple in single-phase applications. Furthermore, the drive may not be able to operate properly if the current circulating through the single-phase converter is not controlled.

Conventional methods of synchronizing a grid include using a phase lock loop (PLL) having a standard synchronous reference frame. However, such conventional methods may not be sufficient for alleviating the effects associated with an unbalanced grid, particularly the effects associated with single-phase converter applications. Methods of decreasing the effects of voltage and/or current imbalance in a grid that employs single-phase applications may improve the performance and synchronous operation of the grid.

BRIEF DESCRIPTION

One embodiment relates to a method for synchronizing to an electric grid. The method includes receiving a voltage vector of the electric grid and generating a quadrature signal of the voltage vector using a quadrature tracking filter (QTF). The method also includes performing a phase-locked-loop (PLL) operation on the quadrature signal to determine a phase angle of the voltage vector. Further, the method includes determining a grid frequency of the electric grid and applying the determined grid frequency to algorithms of the QTF.

Another embodiment relates to a grid system. The grid system includes an electric grid, a converter configured to receive voltage from the electric grid, a quadrature tracking filter (QTF) configured to output a quadrature signal based on a voltage signal proportional to the voltage received by the converter from the electric grid, and a phase-locked loop (PLL) configured to determine a phase angle of the grid based on the quadrature signal from the QTF. The grid system further includes a frequency estimator coupled to the QTF. The frequency estimator is configured to estimate a grid frequency of the electric grid and configured to transmit the grid frequency estimate to the QTF In another implementation, a frequency estimator in an electric grid system. The frequency estimator is configured to estimate a grid frequency of an electric grid in the electric grid system and transmit the estimated grid frequency to a quadrature tracking filter (QTF) of the electric grid system. The QTF is configured to input a voltage vector of the electric grid and output a quadrature signal to a phase-locked-loop (PLL) configured to estimate a phase angle of the electric grid.

DRAWINGS

These and other features, aspects, and advantages of the present invention will become better understood when the following detailed description is read with reference to the accompanying drawings in which like characters represent like parts throughout the drawings, wherein.

Figure 7:
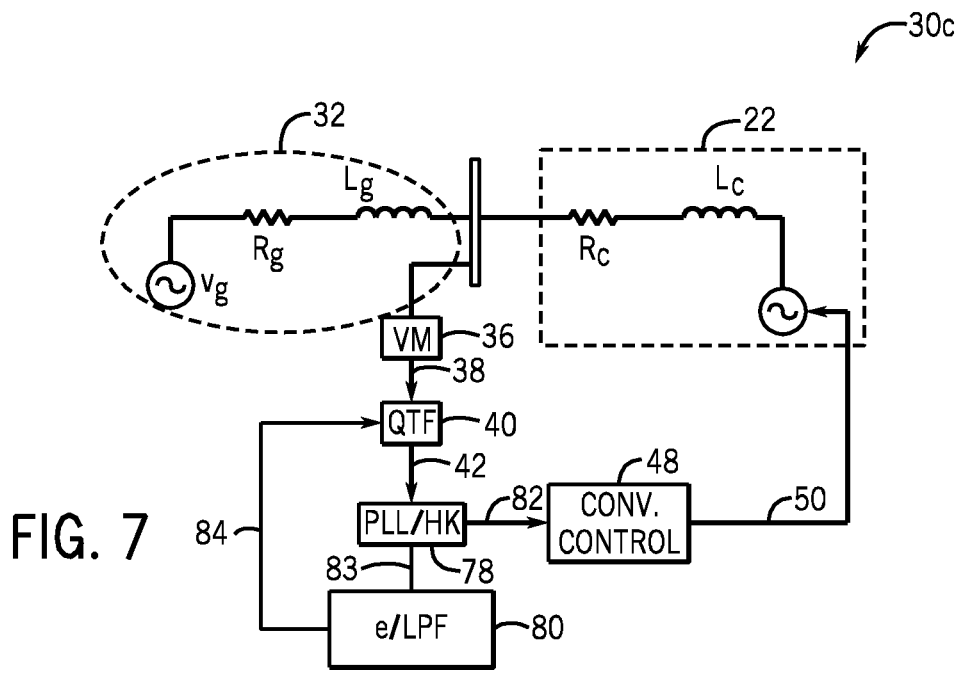
Figure 8:
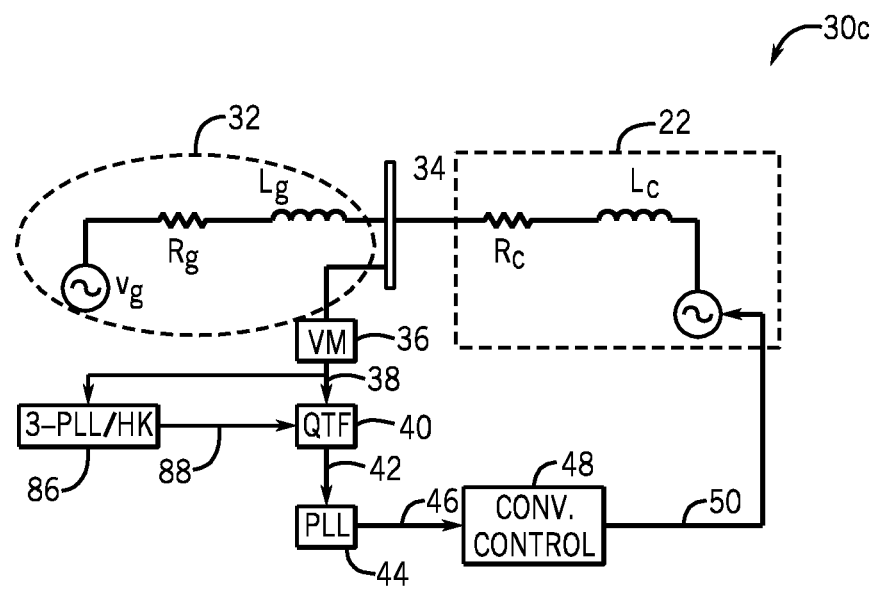

FIG. 7 is a schematic diagram of a grid system using a PLL with a harmonic killer and a frequency estimator to estimate a grid frequency as an input to the QTF, in accordance with one embodiment of the present techniques; and FIG. 8 is a schematic diagram of a grid system using a three-phase PLL to estimate frequencies for three phases of the electric grid as inputs to the QTF, in accordance with one embodiment of the present techniques.

DETAILED DESCRIPTION

An electric grid typically includes a network of loads (e.g., motors, end devices, etc.) which may be interconnected to enable communication between the loads and/or transmission of power to the loads. For example, an industrial grid may include power generators which generate power to be distributed to various motors or other devices powered via the grid. A grid may include alternating current (AC) power sources operating in parallel. Power generated and distributed by various sources (e.g., a power plant, a generator, etc.) may be synchronized in frequency, amplitude, and/or phase angle. Synchronization of AC power may result in the efficient transmission and/or distribution of power.

Figure 1:
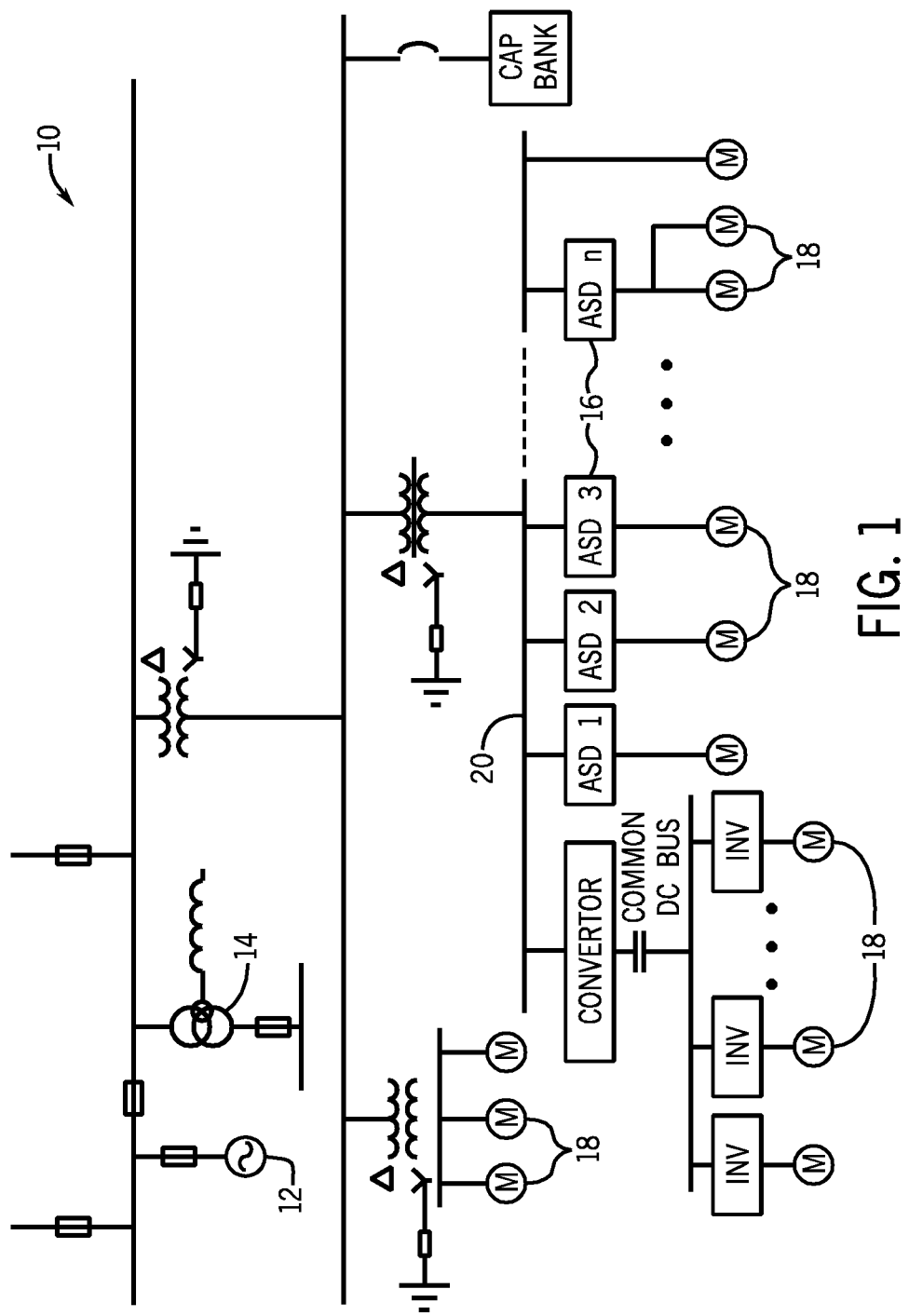
FIG. 1 is a block diagram illustrating a power grid system, in accordance with one embodiment of the present techniques.

One example of an electric grid system 10 may be illustrated in FIG. 1, where a generator 12 may deliver power through the grid system 10 to the motors 18 of different devices. The system 10 may include a transformer 14, which may control voltages used for delivering power. As each device may operate on different speeds, the grid system 10 may also include adjustable speed drives (ASDs) 16 configured to adjust the operating speed of the motors 18 for each device.

A typical electric grid system may not always operate balanced, as the loads (e.g., the devices connected to the motors 18) may not be evenly distributed between phases. The connection or disconnection of any motor 18 may also affect the signals distributed by the generator 12 and the three-phase transformer 14. Furthermore, a voltage imbalance at one motor 18 may affect the synchronization of other motors 18 coupled to the unbalanced motor 18. For example, at the point of common coupling 20, voltage imbalance at a motor 18 coupled to ASD1 may also result in voltage imbalance at a motor 18 coupled to ASD2 or ASD3, as there is no impedance between the motors 18 to prevent the voltage imbalance from propagating through commonly coupled motors 18 of the grid system 10. As discussed, such imbalance (i.e., discrepancies in the amplitudes, frequencies, and/or phase angles) of the two coupled voltages may cause a large current imbalance, which may damage both systems.

Furthermore, while a three-phase transformer is represented in the illustrated grid system 10, the present techniques may be suitable for single phase applications or applications having different numbers of phases. Power converters used in single-phase applications may include, for example, fundamental front end (FFE) regenerative braking, photovoltaic systems, or residential systems. Due to the nature of single-phase power converter systems, voltage imbalances in a single-phase converter may be particularly damaging to the grid system. Moreover, single-phase systems may be more difficult to monitor using standard PLL techniques.

Figure 2:
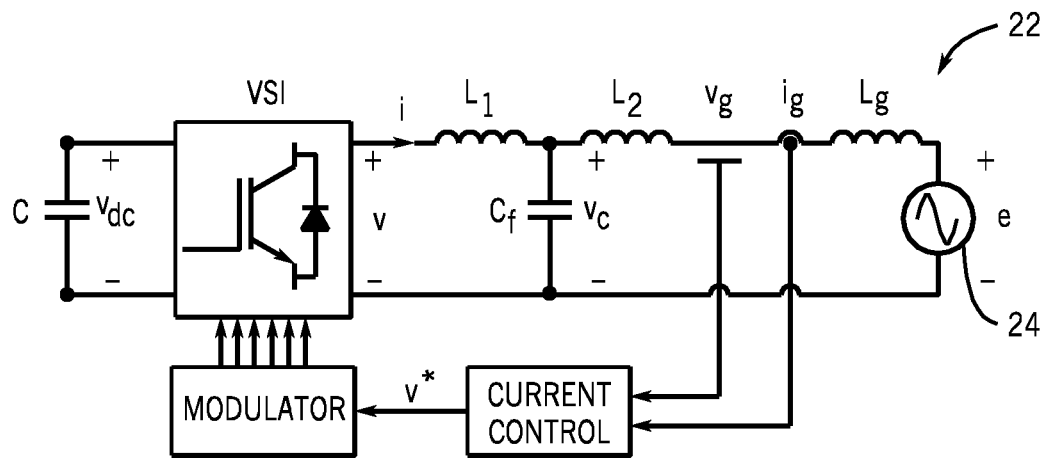
FIG. 2 is a schematic diagram representing a single-phase power converter, in accordance with one embodiment of the present techniques.

An example of a single-phase power converter is illustrated in FIG. 2. In some embodiments, a grid system 10 may be connected to a converter 22 having a single phase power source 24. Typically, a phase-locked loop (PLL) is utilized for controlling phase synchronization of a grid by regulating to zero the difference between the PLL output δ' and the phase δ of two measured inputs A sin δ and A cos δ. However, in single-phase systems, a single-phase voltage vector may not be monitored with sufficient accuracy using a two-input PLL.

Figure 3:
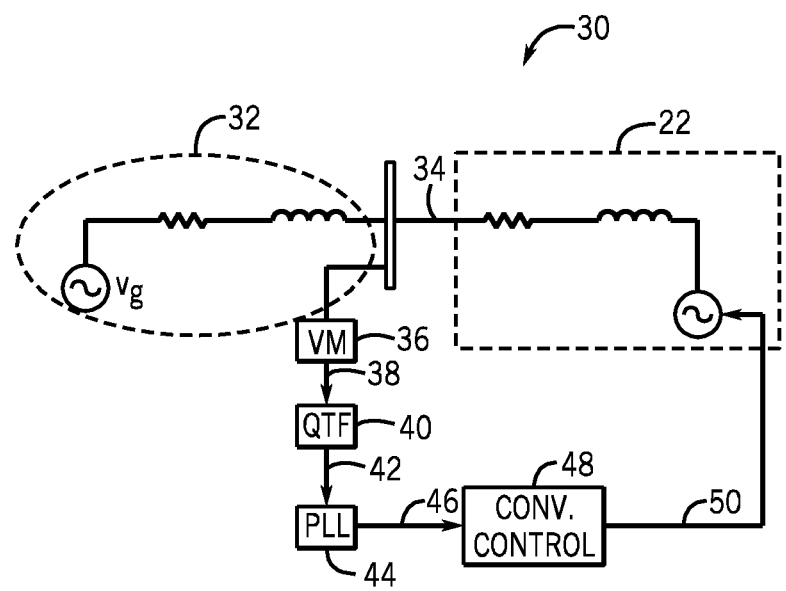
FIG. 3 is a schematic diagram of a grid system using a quadrature tracking filter (QTF) and a phase-locked loop to monitor the voltage vector of a single-phase converter, in accordance with one embodiment of the present techniques.

In some embodiments, line synchronization system using a quadrature tracking filter (QTF) with a PLL may be suitable for tracking a single-phase system and/or for individually tracking a single phase in a multi-phase system. FIG. 3 is a block diagram of a line synchronization system 30 having a grid 32 connected to a single-phase converter 22. In some embodiments, the converter 22 may draw AC power from the grid 32. The line synchronization system 30 may also include a suitable voltage measurement device 36 which outputs a voltage measurement 38 to the QTF 40. The QTF 40 may output a quadrature voltage set 42 from the single-phase voltage measurement 38, and this quadrature voltage set 42 may be input to the PLL 44, which may output an angle signal 46 based on the quadrature voltage set 42. The angle signal 46 may be transmitted to a converter controller 48 which may generate a control signal 50 based on the angle signal 46 to control operations of the converter 22.

In some embodiments, the QTF 40 may be replaced by a quadrature signal generator using a suitable transformer, such as a Hilbert transformer, or a transport delay block suitable for shifting the phase of the voltage measurement 38 by 90 degrees with respect to the fundamental frequency of the input signal, thereby creating the quadrature voltage set 42. The QTF 40 may generate the quadrature voltage set 42 using any suitable algorithm which may output a multi-phase quadrature voltage. Furthermore, the QTF 40 may generate the quadrature voltage voltage set 42 from a single-phase voltage input, or from an n-phase (any number of phases) voltage input. Equation (1) below represent a single input, multiple output quadrature tracking filter:

$$\begin{bmatrix} x_1'(t) \\ x_2'(t) \end{bmatrix} = \begin{bmatrix} -a & -\omega_0 \\ \omega_0 & 0 \end{bmatrix} * \begin{bmatrix} x_1(t) \\ x_2(t) \end{bmatrix} + \begin{bmatrix} a \\ 0 \end{bmatrix} * u(t) \quad \text{equation (1)}$$

Equation (2) represents a multiple input, multiple output quadrature tracking filter:

$$\begin{bmatrix} x_1'(t) \\ x_2'(t) \end{bmatrix} = \begin{bmatrix} -a & 0 \\ 0 & 0 \end{bmatrix} * \begin{bmatrix} x_1(t) \\ x_2(t) \end{bmatrix} + \begin{bmatrix} a & -x_1(t) \\ x_2(t) & 0 \end{bmatrix} * \begin{bmatrix} u(t) \\ \omega_0(t) \end{bmatrix} \quad \text{equation (2)}$$

For example, the single input, multiple output quadrature tracking filter represented by equation (1) may be suitable for inputting a frequency of the voltage vector and outputting a quadrature signal having frequency and voltage components. The multiple input, multiple output quadrature tracking filter represented by equation (2) may be suitable for inputting a frequency and a voltage of the voltage vector and outputting a quadrature signal having frequency and voltage components.

Furthermore, in both the single input, multiple output QTF of equation (1) and the multiple input, multiple output QTF of equation (2), two implementations may be used. The two implementations for each of the tracking filters in equations (1) and (2) are represented in equations (3) and (4) below:

$$\begin{bmatrix} y_\alpha(t) \\ y_\beta(t) \end{bmatrix} = \begin{bmatrix} 1 & 0 \\ 0 & 1 \end{bmatrix} * \begin{bmatrix} x_1(t) \\ x_2(t) \end{bmatrix} \quad \text{equation (3)}$$

$$\begin{bmatrix} y_\alpha(t) \\ y_\beta(t) \end{bmatrix} = \begin{bmatrix} 1 & 0 \\ 0 & -1 \end{bmatrix} * \begin{bmatrix} x_1(t) \\ x_2(t) \end{bmatrix} \quad \text{equation (4)}$$

As indicated in equations (3) and (4) above, the sign on the second state is positive in equation (3) and negative in equation (4), as the reference frames used in the transformations may have two different rotations and different possible convergences. In some embodiments, the QTF 40 may store algorithms to perform either single input, multiple output quadrature tracking, or multiple input, multiple output quadrature tracking, depending on the inputs received. In some embodiments, the QTF 40 may include processing components for determining the appropriate algorithms to apply on the voltage measurement 38, or the QTF 40 may include processing components for applying all algorithms on the voltage measurement 38 and determining suitable outputs as the quadrature voltage set 42.

Figure 4:
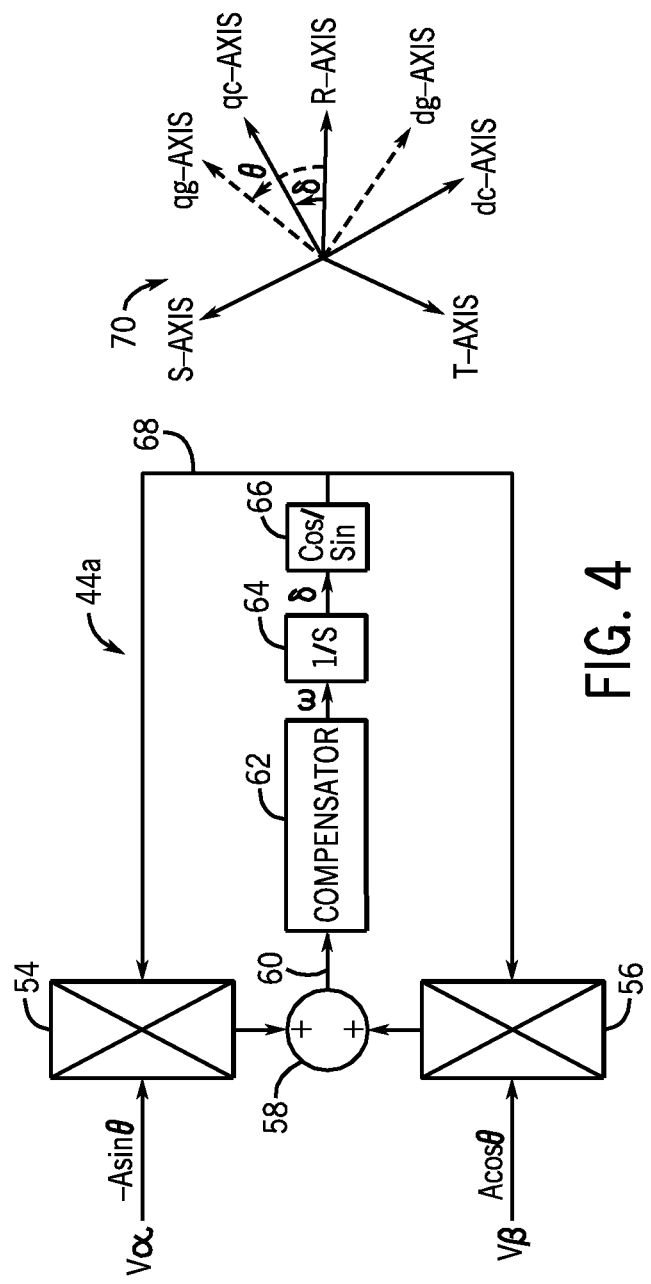
FIG. 4 is a block diagram representing a phase-locked-loop (PLL) in the grid system of FIG. 3 which may be used to monitor a voltage vector of a single-phase converter in the grid system, in accordance with one embodiment of the present techniques.

As illustrated in FIG. 3, once a quadrature voltage set 42 is generated by a quadrature tracking filter 40, the quadrature voltage set 42 may be input to a phase-locked loop 44. One example of a synchronization technique using a PLL 44a and its corresponding reference frame 70 is represented in FIG. 4. While a grid may supply voltage in three one phase or in any number (n) of phases, the phases may be depicted as having a quadrature voltage input (e.g., $V_\beta$) from the QTF 40 and an internally generated signal (e.g., $V_\alpha$). The two inputs may be in the form of sinusoidal waveforms which are 90° out of phase, rotating in steady state, and at the frequency of the grid voltage.

The instantaneous angular position δ of the equivalent vector to the phase voltages of the grid may be regulated to a feedback loop which regulates the voltage in the d-axis ($V_d$ 60), or the sum of the inputs via adder 58, to the value of the reference signal frequency (e.g., zero in this case). Alternatively, in some embodiments, the feedback loop may regulate the voltage in the q-axis to a reference value of one if a per-unit value is considered. Using the d-axis regulation as an example, the detected d-component of the voltage vector $V_d$ 60 may also be referred to as an error signal. $V_d$ 60 may be transmitted to a compensator 62 which determines a frequency estimate ω of the grid voltage. The frequency estimate ω may then be integrated by an integrator 64 to determine a phase angle estimate δ of the grid voltage. The phase angle δ may be used by another transformation 66 to output a sinusoid and a cosinusoid 68, which may be fed back and multiplied with the original inputs −A sin θ and A cos θ (which is depicted as having an amplitude of 1 after normalization of the gain 68) at the multipliers 54 and 56 to generate, when added, a new error signal $V_d$ 60.

Figure 5:
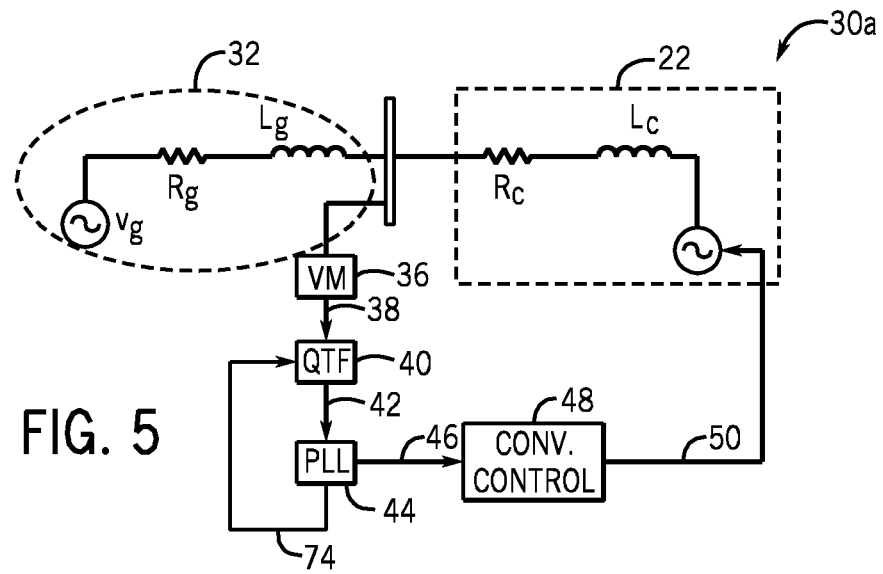
FIG. 5 is a schematic diagram of a grid system using a frequency of the PLL as an input to the QTF, in accordance with one embodiment of the present techniques.

For certain operations and applications of the grid system 30, the line frequency of the grid 32 may be tracked. In one embodiment, an estimate of the frequency $\omega_e$ may be fed to the quadrature tracking filter directly from the frequency of the phase-locked-loop. as illustrated in FIG. 5, the grid system 30 involves feeding the estimated frequency $\omega_e$ from the PLL 44 directly back to the QTF 40 and using the $\omega_e$ in the QTF algorithm (e.g., equations (1) and/or (2)).

Figure 6:
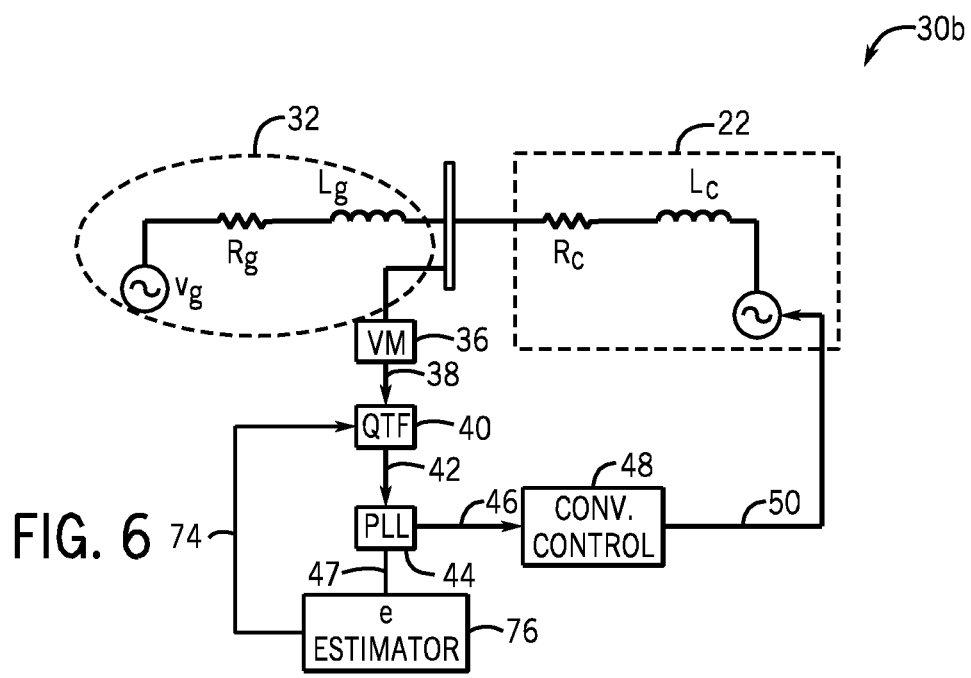
FIG. 6 is a schematic diagram of a grid system using a frequency estimator to estimate a grid frequency as an input to the QTF, in accordance with one embodiment of the present techniques.

To improve the stability of the grid system 30, in some embodiments, a frequency estimator may be used to estimate the frequency of the grid. For example, as illustrated in FIG. 6, the grid system 30b includes a frequency estimator 76 suitable for estimating the grid frequency in the system 30. In some embodiments, the frequency estimator 76 may include one or more low pass filters which filter the frequency of the PLL 44 and feed the estimated grid frequency 74 back to the QTF 40. The QTF 40 may continuously apply updated grid frequencies 74 from the frequency estimator 76 in the QTF algorithms. In some embodiments, the frequency estimator 76 may improve the stability of the system 30b by adjusting the bandwidth of its low pass filter. In one embodiment, the frequency estimator 76 uses a low pass filter of approximately 50 rad/s. In another embodiment, the frequency estimator 76 uses a low pass filter of approximately 200 rad/s.

In another embodiment, as illustrated in FIG. 7, a grid system 30c includes a PLL with a harmonic killer (referred to as PLL/HK 78) with a frequency estimator and low pass filter (referred to as $\omega_e$/LPF 80). The harmonic killer in the PLL/HK 78 may regulate and/or minimize harmonic disturbances by reducing the harmonics generated by the PLL, which may be caused by the discrete nature of the PLL. In some embodiments, the PLL/HK 78 may output a frequency signal 83 having reduced harmonics to the $\omega_e$/LPF 80. Typically, when harmonic distortion is not present, a high bandwidth PLL may detect the phase angle and amplitude of the voltage vector to maintain grid synchronization. When harmonic distortion is present (e.g., the voltage is distorted with high-order harmonics), the bandwidth of the PLL may be reduced to reject and eliminate the effect of the harmonics on the output. For example, the LPF of the $\omega_e$/LPF 80 may be reduced to approximately 50 rad/s to reduce the effect of harmonics on the output 82. The filtered output $\omega_e$ 84 may then be transmitted to the QTF 40 which may input the $\omega_e$ into the quadrature tracking filter algorithms.

FIG. 8 is a schematic diagram of another embodiment of a grid system 30c which may be suitable for grids having a three-phase power supply. The grid system 30c includes a three-phase PLL with a harmonic killer (referred to as the three-phase PLL/HK 86) which generates center frequencies in all phases of the grid 32. Additionally, the harmonic killer in the three-phase PLL/HK 86 reduces harmonics in the grid 32. In one embodiment, the three-phase PLL/HK 86 may receive the measured voltage 38. The three-phase PLL may determine the frequency $\omega_e$ of the grid while the harmonic killer reduces the harmonic disturbances generated by the PLL. The harmonic-reduced frequency $\omega_e$ may be input to the QTF algorithms, which may generate a quadrature signal based on the input $\omega_e$ and the voltage measurement 38.

As discussed with respect to FIGS. 5-8, the present techniques include many different configurations of the grid system 30 for synchronizing the grid 32 using a quadrature tracking filter, 40, a phase-locked-loop 44, harmonic killers, frequency estimators 76, and/or a three-phase phase-locked-loop 86. In different grid systems 30 and/or for different types of connected converters 22, different configurations may be appropriate. Furthermore, the present techniques are suitable for monitoring a voltage vector of a single-phase power converter or for monitoring a voltage vector of a multi-phase power converter.

The configuration of embodiments of the present techniques of quadrature tracking PLL is not limited to the configurations illustrated in FIGS. 4-6. Other algorithms or transformations may be suitable for monitoring a voltage vector having a single phase. For example, the quadrature set may be algebraically combined to form balanced three phase sets. Furthermore, the present techniques may involve additional processing which may be in additional and/or external devices.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A method for synchronizing an electric grid, comprising:
   receiving a voltage vector of the electric grid, wherein
      receiving the voltage vector of the electric grid com- prises measuring a voltage drawn from the electric grid by a single-phase power converter configured to connect to the electric grid or a multi-phase power converter configured to connect to the electric grid;

generating a quadrature signal of the voltage vector using a quadrature tracking filter (QTF);

performing a phase-locked-loop (PLL) operation on the quadrature signal to determine a phase angle of the voltage vector;

determining a grid frequency of the electric grid; and applying the determined grid frequency to algorithms of the QTF.

2. The method of claim 1, wherein the grid frequency of the electric grid comprises a frequency of the PLL.

3. The method of claim 1, wherein determining the grid frequency of the electric grid comprises low pass filtering a frequency of the PLL.

4. The method of claim 1, wherein performing the PLL operation on the quadrature signal comprises reducing harmonics in the quadrature signal.

5. The method of claim 1, wherein performing the PLL operation on the quadrature signal comprises reducing one or more harmonics in a frequency signal generated by the PLL.

6. The method of claim 1, comprising estimating the grid frequency using a frequency estimator, wherein estimating the grid frequency comprises adjusting a low pass filter in the frequency estimator and applying the low pass filter on a frequency signal of the PLL.

7. The method of claim 1, comprising using a three-phase PLL to determine the grid frequency of the electric grid based on the voltage vector.

8. The method of claim 7, wherein using the three-phase PLL comprises determining a plurality of frequencies that correspond to a plurality of phases of the electric grid.

9. The method of claim 7, wherein using the three-phase PLL comprises reducing harmonics generated by the electric grid.

10. A system, comprising:
a quadrature tracking filter (QTF) configured to output a quadrature signal based on a voltage signal proportional to a voltage received by a converter configured to receive voltage from an electric grid, wherein the converter is either a single-phase power converter configured to connect to the electric grid or a multi-phase power converter configured to connect to the electric grid;
a phase-locked loop (PLL) configured to determine a phase angle of the electric grid based on the quadrature signal from the QTF; and
a frequency estimator coupled to the QTF, wherein the frequency estimator is configured to estimate a grid frequency of the electric grid and configured to transmit the grid frequency estimate to the QTF.

11. The grid system of claim 10, wherein the frequency estimator comprises a low pass filter configured to filter a frequency of the PLL.

12. The grid system of claim 11, wherein the low pass filter is set between 50 rad/s and 200 rad/s.

13. The grid system of claim 10, wherein the PLL comprises a harmonic killer configured to reduce one or more harmonics generated by the PLL.

14. The grid system of claim 10, wherein the frequency estimator comprises a three-phase phase-locked-loop (three-phase PLL) configured to estimate a plurality of center frequencies that correspond to a plurality of phases of the electric grid.

15. The grid system of claim 14, wherein the three-phase PLL comprises a harmonic killer configured to reduce one or more harmonics generated by the electric grid.

16. The grid system of claim 14, wherein the three-phase PLL is configured to output the plurality of center frequencies for the respective plurality of phases to the QTF.

17. A frequency estimator in an electric grid system, wherein the frequency estimator is configured to:
estimate a grid frequency of voltage drawn from the electric grid by a single-phase power converter configured to connect to the electric grid or a multi-phase power converter configured to connect to the electric grid; and
transmit the estimated grid frequency to a quadrature tracking filter (QTF) of the electric grid system, wherein the QTF is configured to input a voltage vector of the electric grid and output a quadrature signal to a phase-locked-loop (PLL) configured to estimate a phase angle of the electric grid, wherein the voltage vector is proportional to the voltage drawn from the electric grid.

18. The frequency estimator of claim 17, comprising a low pass filter configured to filter a frequency of the PLL to estimate the grid frequency.

19. The frequency estimator of claim 18, comprising a harmonic killer configured to reduce one or more harmonics in the electric grid system.

20. A frequency estimator in an electric grid system, wherein the frequency estimator is configured to:
estimate a grid frequency of an electric grid in the electric grid system;
transmit the estimated grid frequency to a quadrature tracking filter (QTF) of the electric grid system, wherein the QTF is configured to input a voltage vector of the electric grid and output a quadrature signal to a phase-locked-loop (PLL) configured to estimate a phase angle of the electric grid, wherein the frequency estimator comprises a three-phase phase-locked-loop (three-phase PLL) configured to estimate a plurality of center frequencies that correspond to a plurality of phases of the electric grid, wherein the three-phase PLL is configured to output the plurality of center frequencies to the QTF.

* * * * *